United States Patent
Jo et al.

(10) Patent No.: US 11,605,683 B2
(45) Date of Patent: Mar. 14, 2023

(54) ORGANIC LIGHT EMITTING DISPLAY DEVICE INCLUDING COMMON PLANE BLACK MATRIX AND PATTERN BUFFER LAYER

(71) Applicant: LG DISPLAY CO., LTD., Seoul (KR)

(72) Inventors: JeongOk Jo, Seoul (KR); MinJic Lee, Paju-si (KR); HongSik Kim, Goyang-si (KR); Yeseul Han, Goyang-si (KR); Kwanghyun Choi, Seoul (KR)

(73) Assignee: LG Display Co., Ltd., Seoul (KR)

( * ) Notice: Subject to any disclaimer, the term of this patent is extended or adjusted under 35 U.S.C. 154(b) by 97 days.

(21) Appl. No.: 17/133,130

(22) Filed: Dec. 23, 2020

(65) Prior Publication Data

US 2021/0202594 A1    Jul. 1, 2021

(30) Foreign Application Priority Data

Dec. 30, 2019    (KR) .................. 10-2019-0177430

(51) Int. Cl.
*H01L 27/32* (2006.01)
*H01L 51/00* (2006.01)
(Continued)

(52) U.S. Cl.
CPC ........ *H01L 27/326* (2013.01); *H01L 51/0097* (2013.01); *G02F 1/133512* (2013.01);
(Continued)

(58) Field of Classification Search
CPC ... H01L 27/326; H01L 27/322; H01L 27/323; H01L 27/3218; H01L 27/3244;
(Continued)

(56) References Cited

U.S. PATENT DOCUMENTS 9,671,646 B1 * 6/2017 Tang .................... H01L 27/1248
10,497,292 B2   12/2019 Jung et al.
(Continued)

FOREIGN PATENT DOCUMENTS

CN    107768312 A    3/2018
CN    110491924 A    11/2019
(Continued)

OTHER PUBLICATIONS

Office Action dated Nov. 18, 2021, issued in corresponding JP Patent Application No. 2020-208939.
(Continued)

*Primary Examiner* — Ida M Soward
(74) *Attorney, Agent, or Firm* — Morgan, Lewis & Bockius LLP

(57) ABSTRACT

According to an aspect of the present disclosure, an organic light emitting display device includes an organic light emitting display panel including a plurality of sub pixels, a pattern buffer layer disposed on the organic light emitting display panel and patterned so as to overlap at least one sub pixel of the plurality of sub pixels, a color filter layer disposed on the pattern buffer layer and including a plurality of color filters corresponding to the plurality of sub pixels, and a black matrix disposed on the same plane as the pattern buffer layer and dividing the plurality of color filters. Accordingly, generation and spread of cracks when the display device is folded may be effectively suppressed. Therefore, the driveability of the display panel and the reliability of the organic light emitting display device may be improved.

24 Claims, 11 Drawing Sheets

(51) Int. Cl.
*H01L 51/52* (2006.01)
*G02F 1/13* (2006.01)
*G02F 1/1335* (2006.01)
*G02F 1/1362* (2006.01)

(52) U.S. Cl.
CPC .. *G02F 1/133528* (2013.01); *G02F 1/136209* (2013.01); *G09G 2300/0408* (2013.01); *G09G 2300/0804* (2013.01); *H01L 27/322* (2013.01); *H01L 27/323* (2013.01); *H01L 27/3211* (2013.01); *H01L 27/3246* (2013.01); *H01L 51/5246* (2013.01); *H01L 51/5293* (2013.01); *H01L 2251/301* (2013.01)

(58) Field of Classification Search
CPC ............. H01L 27/3211; H01L 27/3246; H01L 51/0097; H01L 51/5281; H01L 51/5284; H01L 51/5253; H01L 51/5293; H01L 51/5246; H01L 2251/5338; H01L 2251/301; G09G 9/301; G09G 2300/0408; G09G 2300/0804; G02F 1/133512; G02F 1/136209; G02F 1/133528; G02F 2001/133357
See application file for complete search history.

(56) References Cited

U.S. PATENT DOCUMENTS

| | | | | |
|---|---|---|---|---|
| 2002/0176039 A1* | 11/2002 | Kanesaka | ......... | G02F 1/133553 349/113 |
| 2005/0007524 A1* | 1/2005 | Luo | .................. | G02F 1/136209 349/110 |
| 2005/0140305 A1* | 6/2005 | Kim | .................... | H01L 27/3251 315/169.3 |
| 2007/0007885 A1* | 1/2007 | Feng | .................... | H01L 27/322 430/7 |
| 2007/0077502 A1* | 4/2007 | Moriya | ............. | G02F 1/133514 430/7 |
| 2007/0145887 A1* | 6/2007 | Chae | .................. | H01L 27/3253 313/506 |
| 2010/0136868 A1* | 6/2010 | Chien | .................. | G06F 3/0412 445/24 |
| 2011/0073885 A1* | 3/2011 | Kim | .................... | H01L 27/3211 257/89 |
| 2011/0084290 A1* | 4/2011 | Nakamura | .......... | H01L 51/5246 257/89 |
| 2013/0341588 A1* | 12/2013 | Jeon | ........................ | G02F 1/174 257/13 |
| 2014/0284590 A1* | 9/2014 | Nakazawa | ............. | H05B 33/26 359/885 |
| 2015/0188091 A1 | 7/2015 | Kudo et al. | | |
| 2015/0318447 A1 | 11/2015 | Choi | | |
| 2017/0200773 A1* | 7/2017 | Li | ........................ | H01L 27/3272 |
| 2017/0207410 A1 | 7/2017 | Cho et al. | | |
| 2018/0033851 A1 | 2/2018 | Kim et al. | | |
| 2018/0053913 A1 | 2/2018 | Lee et al. | | |
| 2018/0088726 A1 | 3/2018 | Gwon et al. | | |
| 2018/0120656 A1* | 5/2018 | Okada | ............... | G02F 1/133514 |
| 2018/0151640 A1* | 5/2018 | Shim | ..................... | H01L 51/5284 |
| 2018/0350884 A1 | 12/2018 | Won et al. | | |
| 2019/0172874 A1 | 6/2019 | Lim et al. | | |
| 2019/0181385 A1* | 6/2019 | Seong | ................. | H01L 51/5253 |
| 2020/0287163 A1 | 9/2020 | Lv | | |
| 2021/0359248 A1* | 11/2021 | Fang | .................... | H01L 51/5246 |

FOREIGN PATENT DOCUMENTS

| | | |
|---|---|---|
| JP | 2007173200 A | 7/2007 |
| JP | 2015144107 A | 8/2015 |
| JP | 2016066470 A | 4/2016 |
| JP | 2018205718 A | 12/2018 |
| JP | 2019012284 A | 1/2019 |
| JP | 2019102462 A | 6/2019 |
| JP | 2019110127 A | 7/2019 |
| KR | 10-2015-0047033 A | 5/2015 |
| KR | 10-2019-0023268 A | 3/2019 |
| TW | 201804594 A | 2/2018 |
| TW | 201813078 A | 4/2018 |
| WO | 2019192348 A1 | 10/2019 |

OTHER PUBLICATIONS

Extended European Search Report dated May 7, 2021, issued in corresponding European Patent Application No. 20213045.6.
Office Action and Search Report dated Sep. 20, 2021, issued in corresponding Taiwan Patent Application No. 109146278.

* cited by examiner

ORGANIC LIGHT EMITTING DISPLAY DEVICE INCLUDING COMMON PLANE BLACK MATRIX AND PATTERN BUFFER LAYER

CROSS-REFERENCE TO RELATED APPLICATIONS

This application claims the priority of Korean Patent Application No. 10-2019-0177430 filed on Dec. 30, 2019, in the Korean Intellectual Property Office, the disclosure of which is incorporated herein by reference.

BACKGROUND

Technical Field

The present disclosure relates to an organic light emitting display device, and more particularly, to an organic light emitting display device with improved folding characteristic and reliability by suppressing generation and spread of crack due to the folding.

Discussion of the Related Art

Unlike a liquid crystal display device (LCD) which includes a backlight, an organic light emitting display device (OLED) does not require a separate light source. Therefore, the organic light emitting display device can be manufactured to be light and thin and has process advantages and has a low power consumption due to the low voltage driving. First of all, the organic light emitting display device includes a self-emitting element and includes layers formed of organic thin films so that the flexibility and elasticity are superior to the other display devices and thus it is advantageous to be implemented as a flexible display device.

Generally, in order to suppress the deterioration of visibility and a contrast ratio due to light which is incident from the outside into the display device, in the organic light emitting display device, a polarizing plate is disposed below a cover member. However, recently, as interest in a flexible and slim display device is increased, instead of a thick polarizing plate, a display device to which a coated polarization film with a relatively small thickness is applied has been proposed. However, there are problems in that the thickness of the coated polarization film is also large and if the thickness is reduced, a function and a display quality of the polarization film are deteriorated. Therefore, it is difficult to implement the polarization film for a stressful foldable display device.

SUMMARY

In order to reduce a folding stress, a display device which applies an anti-reflection layer in which a color filter layer and a black matrix are integrated, rather than the coated polarization film, has been proposed. The anti-reflection layer has a smaller thickness than that of a polarizing plate or a coated polarization film of the related art so that it is possible to implement a thinner display device. When the anti-reflection layer is applied, an inorganic film buffer layer is entirely deposited below the anti-reflection layer to be attached to components therebelow while protecting the components of the display device. However, the inorganic film buffer layer has an excellent barrier characteristic, but low flexibility so that the inorganic film buffer layer is vulnerable to the stress. Therefore, when the display device is bent or folded, there are problems in that a crack is easily generated on the inorganic film buffer layer and the crack spreads. Further, moisture or oxygen permeates the cracked portion from the outside to deteriorate the components and the crack spreads to cause troubles in the driving of the display panel so that the reliability is significantly deteriorated.

Accordingly, embodiments of the present disclosure are directed to an organic light emitting display device that substantially obviates one or more of the problems due to limitations and disadvantages of the related art.

Therefore, an object of the present disclosure is to suppress the generation and spread of the crack due to the folding by reducing a stress of an inorganic film buffer layer disposed below an anti-reflection layer, in an organic light emitting display device in which the anti-reflection layer is applied, instead of a polarizing plate or a polarization film. Another object to be achieved by the present disclosure is to provide an organic light emitting display device with a reduced thickness in which a driving failure and low reliability are improved by suppressing the generation and spread of the crack. Further, another object to be achieved by the present disclosure is to provide an organic light emitting display device which reduces a folding stress to minimize creases generated in a folded portion and is folded in various forms and folded multiple times.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, an organic light emitting display device comprises: an organic light emitting display panel including a plurality of sub pixels, a pattern buffer layer disposed on the organic light emitting display panel and patterned so as to overlap at least one sub pixel of the plurality of sub pixels, a color filter layer disposed on the pattern buffer layer and including a plurality of color filters corresponding to the plurality of sub pixels, and a black matrix disposed on the same plane as the pattern buffer layer and dividing the plurality of color filters. That is, according to the organic light emitting display device according to the exemplary embodiment of the present disclosure, the buffer layer disposed below the color filter layer is patterned to have a predetermined shape so that a stress of the buffer layer at the time of folding is reduced. Accordingly, generation and spread of cracks when the display device is folded may be effectively suppressed.

In another aspect, an organic light emitting display device which includes a plurality of sub pixels, comprises: a substrate, a thin film transistor disposed on the substrate, an organic light emitting element disposed on the thin film transistor, an encapsulation layer disposed on the organic light emitting element, and an anti-reflection layer disposed on the encapsulation layer. The anti-reflection layer includes: a pattern buffer layer patterned so as to overlap at least one sub pixel of the plurality of sub pixels and including at least one open area, a color filter layer disposed on the pattern buffer layer, and a black matrix disposed in the open area. According to the organic light emitting display device according to another exemplary embodiment of the present disclosure, external light reflectance is reduced by the anti-reflection layer so that the deterioration of visibility and a contrast ratio due to the external light may be minimized. Further, a polarizing plate and an adhesive layer are omitted so that the thickness of the display device may be reduced. Further, the buffer layer disposed on the encapsulation layer is patterned to have a predetermined shape to effectively alleviate the folding stress. When the organic light emitting display device is folded, generation and spread of a crack on a buffer layer which is vulnerable to the stress may be suppressed.

Other detailed matters of the exemplary embodiments are included in the detailed description and the drawings.

According to the present disclosure, instead of a polarizing plate or a polarization film of the related art, an anti-reflection layer including a pattern buffer layer, a color filter layer, and a black matrix is applied to the organic light emitting display device so that the thickness of the display device may be reduced while effectively reducing an external light reflectance. Further, the buffer layer disposed below the color filter layer has a patterned structure so that a stress applied to the buffer layer is reduced. Therefore, the generation and spread of cracks when the display device is folded may be effectively suppressed. By doing this, a driving failure due to the generation and spread of the crack is solved and the reliability of the organic light emitting display device may be improved.

According to the present disclosure, a stress of the buffer layer which is relatively vulnerable to the stress is effectively reduced to minimize creases generated in the folded portion. Furthermore, an organic light emitting display device which can be folded in various forms and folded multiple times may be easily implemented while maintaining a high display quality.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Figure 1A:
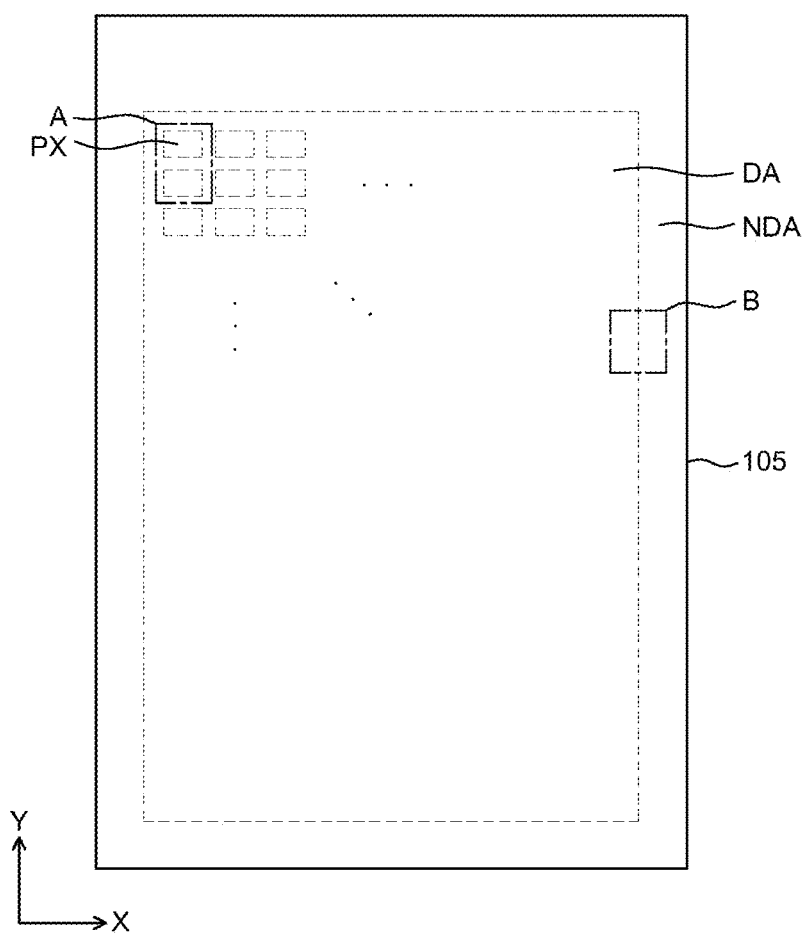
FIG. 1A is a plan view of an organic light emitting display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, the present disclosure will be described in detail with reference to accompanying drawings.

Figure 1B:
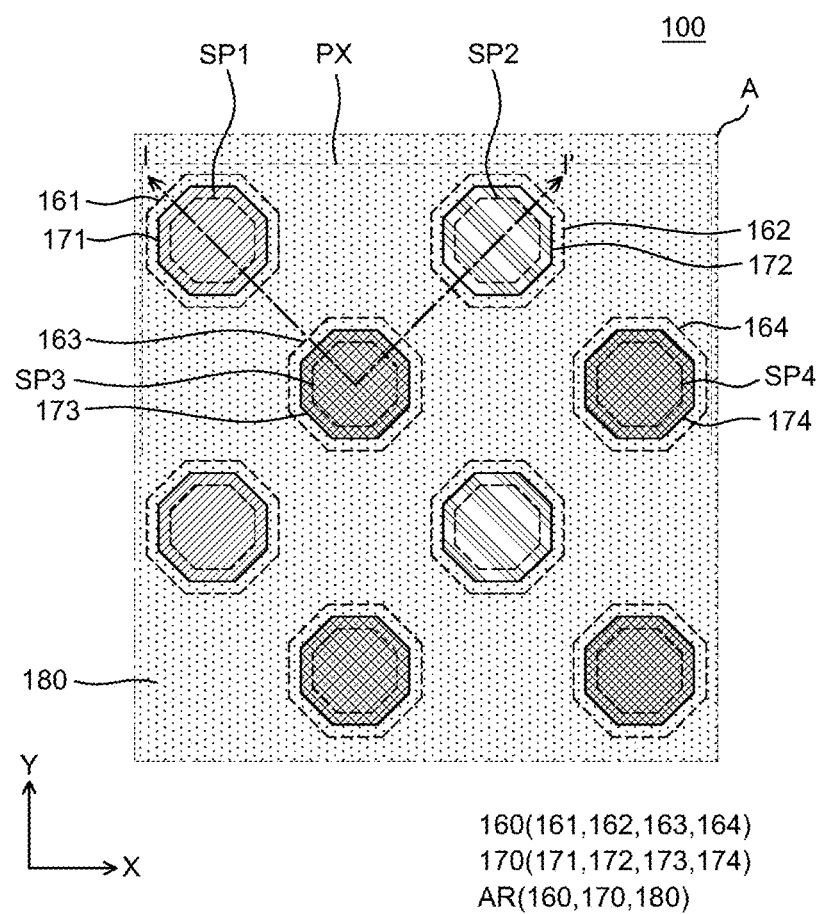
FIG. 1B is an enlarged plan view of an area A of FIG. 1A.
Figure 1C:
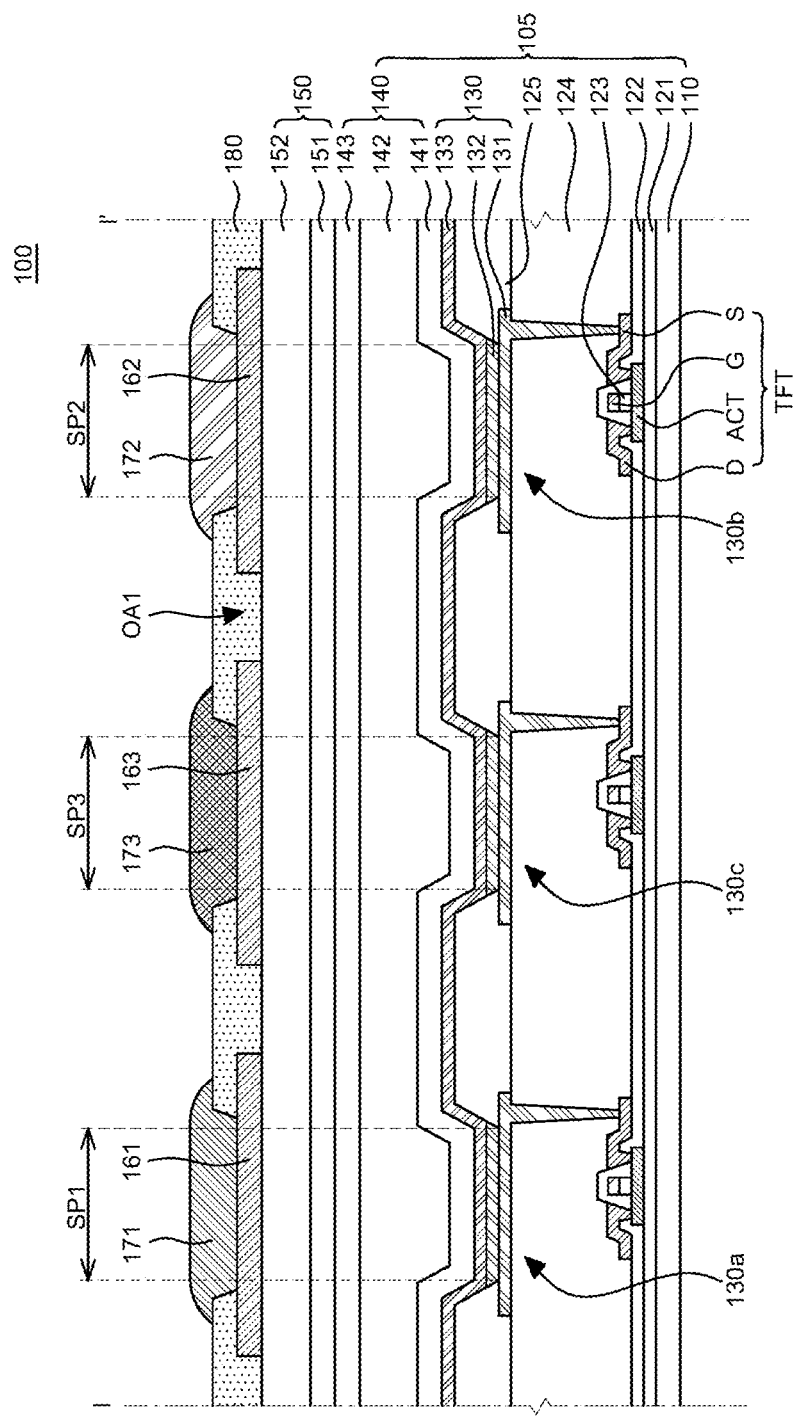
FIG. 1C is a cross-sectional view taken along the line I-I' of FIG. 1B.
Figure 1D:
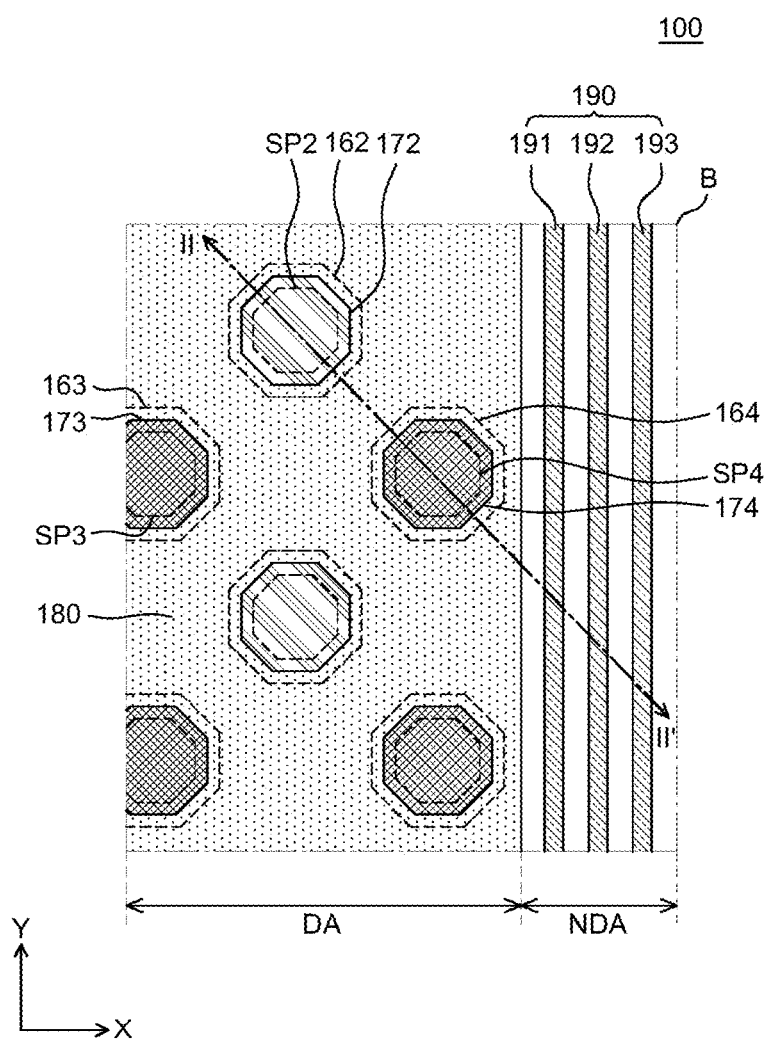
FIG. 1D is an enlarged plan view of an area B of FIG. 1A.
Figure 1E:
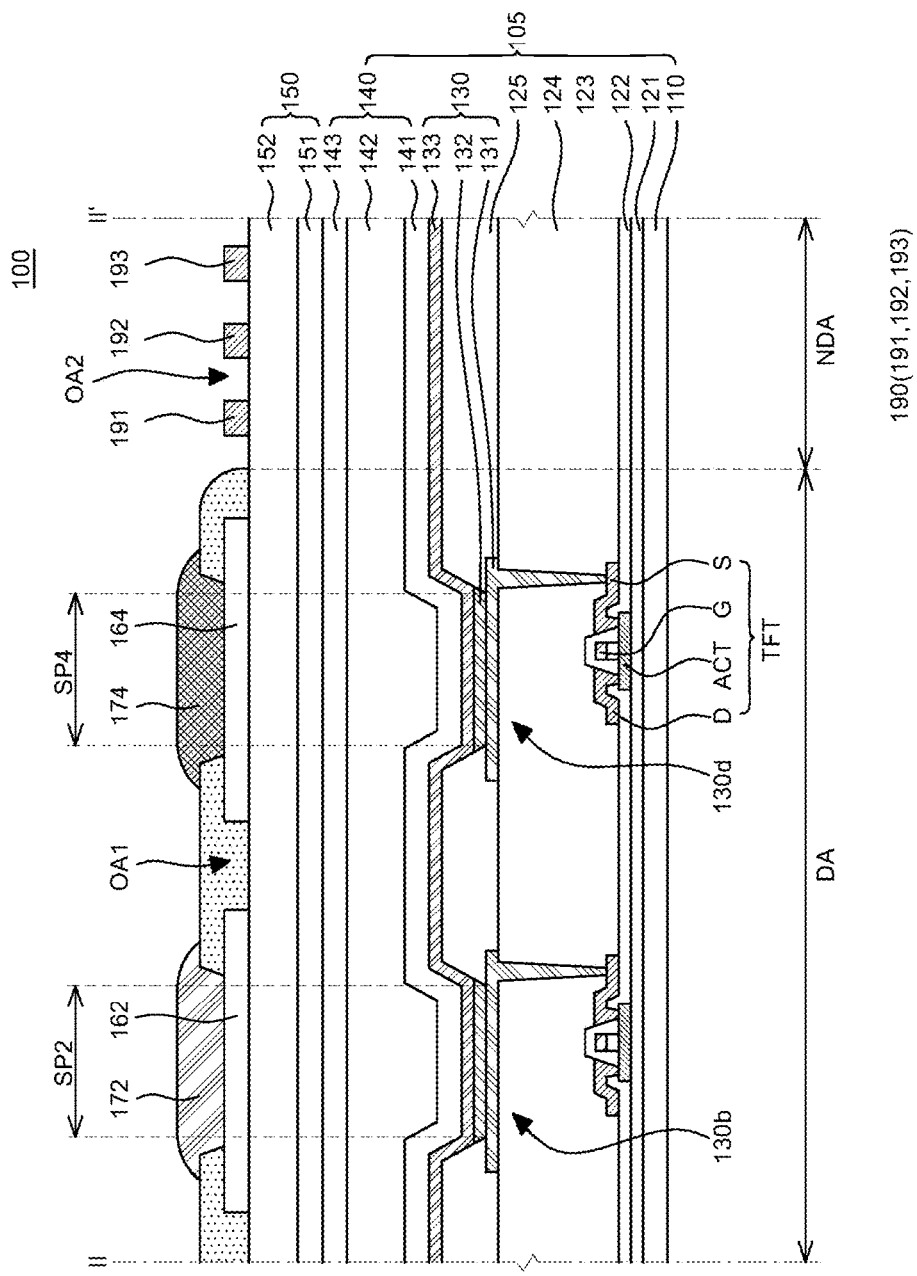
FIG. 1E is a cross-sectional view taken along the line II-II' of FIG. 1D.

FIGS. 1A to 1E are views for explaining a display device according to an exemplary embodiment of the present disclosure. FIG. 1A is a plan view of an organic light emitting display device according to an exemplary embodiment of the present disclosure. FIG. 1B is an enlarged view of an area A of FIG. 1A. FIG. 1C is a cross-sectional view taken along the line I-I' of FIG. 1B. FIG. 1D is an enlarged view of an area B of FIG. 1A. FIG. 1E is a cross-sectional view taken along the line II-II' of FIG. 1D.

Referring to FIGS. 1A, 1B, and 1C, an organic light emitting display device 100 according to an exemplary embodiment of the present disclosure includes an organic light emitting display panel 105, a touch sensor 150, and an anti-reflection layer AR. The anti-reflection layer AR includes a pattern buffer layer 160, a color filter layer 170, and a black matrix 180.

The organic light emitting display panel 105 displays images. The organic light emitting display panel 105 includes a display area DA and a non-display area NDA. The display area DA is an area where a plurality of pixels PX is disposed to substantially display images. In the display area DA, pixels PX including an emission area for displaying images and a driving circuit for driving the pixels PX may be disposed. The non-display area NDA encloses the display area DA. The non-display area NDA is an area where images are not substantially displayed and various wiring lines, driving ICs, and printed circuit boards for driving the pixels PX disposed in the display area DA and the driving circuits are disposed. For example, in the non-display area NDA, various ICs such as a gate driver IC and a data driver IC may be disposed. In the meantime, as described above, in the non-display area NDA, the driving IC and the printed circuit board may be disposed, and a predetermined area is necessary to dispose the driving IC and the printed circuit board.

The plurality of pixels PX is disposed in a matrix and each of the plurality of pixels PX includes a plurality of sub pixels. A sub pixel is an element displaying one color and including an emission area where light is emitted and a non-emission area where light is not emitted, but in the specification, only the emission area where the light is emitted is defined as a sub pixel. Referring to FIG. 1B, one pixel PX includes a first sub pixel SP1, a second sub pixel SP2, a third sub pixel SP3, and a fourth sub pixel SP4. For example, the first sub pixel SP1 and the second sub pixel SP2 are disposed in a first direction (an x-axis direction) and the third sub pixel SP3 and the fourth sub pixel SP4 may be disposed along the first direction to be spaced apart from the first sub pixel SP1 and the second sub pixel SP2 in a second direction (a y-axis direction), but are not limited thereto. The first sub pixel SP1, the second sub pixel SP2, the third sub pixel SP3, and the fourth sub pixel SP4 may display different colors and if necessary, some sub pixels may display the same color.

Each of the first sub pixel SP1, the second sub pixel SP2, the third sub pixel SP3, and the fourth sub pixel SP4 may be any one of a red sub pixel, a green sub pixel, and a blue sub pixel. For example, the sub pixels may be disposed to have a pentile structure in which the first sub pixel SP1 and the second sub pixel SP2 are a red sub pixel and a blue sub pixel, respectively, and both the third sub pixel SP3 and the fourth sub pixel SP4 are green sub pixels. When the plurality of sub pixels SP1, SP2, SP3, and SP4 is disposed with a pentile structure, the number of the first sub pixels SP1 and the second sub pixels SP2 disposed in the display area DA may be reduced as compared with the sub pixels disposed to have a stripe structure. As the number of sub pixels is reduced, an aperture ratio may be improved while maintaining the same level of cognitive resolution compared to the stripe structure. Further, the number of sub pixels is reduced so that a manufacturing process of the organic light emitting display panel is simplified and it is advantageous in terms of the power consumption. In the pentile structure, in consideration of a luminance and a color temperature, the third sub pixel SP3 and the fourth sub pixel SP4 which are green may have a smaller area than that of the first sub pixel SP1 which is red and the second sub pixel SP2 which is blue. Hereinafter, the organic light emitting display device 100 according to the exemplary embodiment of the present disclosure will be described under the assumption that the first sub pixel SP1 is a red sub pixel, the second sub pixel SP2 is a blue sub pixel, and the third and fourth sub pixels SP3 and SP4 are green sub pixels. However, colors of the sub pixels are described as an example for the convenience of description so that the present disclosure is not limited thereto.

In FIG. 1B, it is illustrated that the plurality of sub pixels SP1, SP2, SP3, and SP4 is formed with a pentile structure, but is not limited thereto. The color and the arrangement of the sub pixels may vary in various forms depending on the necessity. Further, in FIG. 1B, it is illustrated that the plurality of sub pixels SP1, SP2, SP3, and SP4 has an octagonal shape, but it is not limited thereto and the shape of the sub pixels may be changed in various shapes. For example, each sub pixel may have a circular shape, an elliptical shape, or a polygonal shape other than an octagonal shape.

The organic light emitting display panel 105 includes a substrate 110, a thin film transistor TFT, an organic light emitting element 130, and an encapsulation layer 140 and the organic light emitting element 130 may include an anode 131, an organic light emitting layer 132, and a cathode 133.

The substrate 110 is a base member supporting various elements of the organic light emitting display panel 105 and formed of an insulating material. For example, the substrate 110 may be a glass substrate or a plastic substrate. For example, the plastic substrate may be selected from polyimide, polyethersulfone, polyethylene terephthalate, and polycarbonate, but is not limited thereto. In order to implement a flexible property and a foldable property, when a plastic substrate having a flexibility is used, a support member such as a back plate may be disposed below the substrate 110. The plastic substrate having flexibility is thinner and has a weaker rigidity than the glass substrate so that when various elements are disposed, the plastic substrate may be sagged. The back plate supports the substrate 110 formed of a plastic material so as not to be sagged and protects the organic light emitting display panel 105 from moisture, heat, and impacts. For example, the back plate may be a metal material such as stainless steel (SUS) or a plastic material such as polymethylmethacrylate, polycarbonate, polyvinyl alcohol, acrylonitrile-butadiene-styrene, or polyethylene terephthalate.

When the back plate is disposed below the substrate 110, an adhesive layer may be disposed between the substrate 110 and the back plate to attach them. The adhesive layer may be a photo transparent adhesive or a pressure-sensitive adhesive but is not limited thereto.

A substrate buffer layer 121 may be disposed on the substrate 110 to suppress permeation of oxygen or moisture. The substrate buffer layer 121 may be formed as a single layer and may be formed with a multi-layered structure if necessary.

On the substrate buffer layer 121, a thin film transistor TFT including a gate electrode G, an active layer ACT, a source electrode S, and a drain electrode D is disposed. The thin film transistor TFT is disposed in each area of the first sub pixel SP1, the second sub pixel SP2, the third sub pixel SP3, and the fourth sub pixel SP4. In FIG. 1C, only a driving thin film transistor TFT, among various thin film transistors TFT which may be included in the organic light emitting display device 100, is illustrated for the convenience of description. Further, it is described that the thin film transistor TFT has a coplanar structure as an example in FIG. 1C, but the present disclosure is not limited thereto and a thin film transistor TFT having an inverted staggered structure may also be used.

For example, the active layer ACT is disposed on the substrate buffer layer 121 and a gate insulating layer 123 is disposed on the active layer ACT to insulate the active layer ACT and the gate electrode G from each other. Further, an interlayer insulating layer 122 is disposed on the substrate buffer layer 121 to insulate the gate electrode G from the source electrode S and the drain electrode D. The source electrode S and the drain electrode D which are in contact with the active layer ACT are formed on the interlayer insulating layer 122. A planarization layer 124 may be disposed on the thin film transistor TFT. The planarization layer 124 planarizes an upper portion of the thin film transistor TFT. The planarization layer 124 may include a contact hole electrically connecting the thin film transistor TFT and the anode 131 of the organic light emitting element 130.

The organic light emitting element 130 is disposed on the planarization layer 124. The organic light emitting element 130 includes a first organic light emitting element 130a disposed in the first sub pixel SP1, a second organic light emitting element 130b disposed in the second sub pixel SP2, and a third organic light emitting element 130c disposed in the third sub pixel SP3. Each organic light emitting element 130a, 130b, 130c includes an anode 131, a cathode 133, and an organic light emitting layer 132.

The anode 131 is disposed on the planarization layer 124. The anode 131 is formed of a conductive material having a high work function to supply holes to the organic light emitting layer 132. The anode 131 may be a transparent conductive layer formed of transparent conductive oxide TCO. For example, the anode 131 may be formed by one or more selected from transparent conductive oxides such as indium tin oxide ITO, indium zinc oxide IZO, indium tin zinc oxide ITZO, tin oxide $SnO_2$, zinc oxide ZnO, indium copper oxide ICO, and Aluminum-doped zinc oxide AZO, but is not limited thereto.

The anode 131 may be separately formed for each of the first sub pixel SP1, the second sub pixel SP2, and the third sub pixel SP3. A bank 125 is disposed on the anode 131 and the planarization layer 124. The bank 125 divides adjacent sub pixel areas. Further, the bank 125 may also divide a pixel area configured by a plurality of sub pixels. The bank 125 may be formed of an insulating material which insulates anodes 131 of adjacent sub pixels SP1, SP2, and SP3 from each other. Further, the bank 125 may be configured by a black bank having high light absorptance to suppress color mixture between adjacent sub pixels SP1, SP2, and SP3.

The cathode 133 is disposed on the anode 131. The cathode 133 may be formed of a metal material having a low work function to smoothly supply electrons to the organic light emitting layer 132. For example, the cathode 133 may be formed of a metal material selected from calcium (Ca), barium (Ba), aluminum (Al), silver (Ag), and alloys including one or more of them, but is not limited thereto.

The cathode 133 is formed on the anode 131 as one layer without being patterned. That is, the cathode 133 is formed in the first sub pixel SP1, the second sub pixel SP2, and the third sub pixel SP3 as a single layer. When the organic light emitting display device 100 is driven as a top emission type, the cathode 133 is formed to have a very small thickness to be substantially transparent.

The organic light emitting layer 132 is disposed between the anode 131 and the cathode 133. The organic light emitting layer 132 is a layer in which electrons and holes are coupled to emit light. The organic light emitting layer 132 of the first organic light emitting element 130a may be a red organic light emitting layer, the organic light emitting layer 132 of the second organic light emitting element 130b may be a blue organic light emitting layer, and the organic light emitting layer 132 of the third organic light emitting element 130c may be a green organic light emitting layer. For example, in the blue organic light emitting layer, the electron and the hole are coupled to emit blue light.

In order to improve luminous efficiency of the organic light emitting display panel, a hole injection layer, a hole transport layer, an electron transport layer, and an electron injection layer may be further included. For example, the hole injection layer and the hole transport layer may be disposed between the anode 131 and the organic light emitting layer 132 and the electron transport layer and the electron injection layer may be disposed between the organic light emitting layer 132 and the cathode 133.

The encapsulation layer 140 is disposed on the cathode 133 to minimize deterioration of the organic light emitting display panel 105 due to moisture and oxygen. The encapsulation layer 140 planarizes an upper surface of the organic light emitting display panel 105 and fills a space between the cathode 133 and the touch sensor 150. The encapsulation layer 140 may be formed with a multi-layered structure in which an inorganic layer formed of an inorganic insulating material and an organic layer formed of an organic material are laminated. For example, the encapsulation layer 140 may be configured by at least one organic layer and at least two inorganic layers and have a multi-layered structure in which the inorganic layers and the organic layer are alternately laminated, but is not limited thereto. For example, the encapsulation layer 140 may have a triple-layered structure including a first inorganic layer 141, an organic layer 142, and a second inorganic layer 143. For example, the first inorganic layer 141 and the second inorganic layer 143 may be independently formed of one or more selected from silicon nitride SiNx, silicon oxide SiOx, silicon oxynitride SiON, and aluminum oxide $Al_2O_3$, but is not limited thereto. For example, the organic layer 142 may be formed of one or more selected from epoxy resin, polyimide, polyethylene, and silicon oxycarbide (SiOC), but is not limited thereto.

The touch sensor 150 is disposed on the encapsulation layer 140 to impart a touch sensing function to the organic light emitting display device 100. The touch sensor 150 may be directly formed on the encapsulation layer 140 without using an adhesive member. As the touch sensor 150 is directly formed on the encapsulation layer 140, the adhesive member which attaches the touch sensor 150 and the organic light emitting display panel 105 is omitted so that the thickness of the organic light emitting display device 100 may be reduced.

The touch sensor 150 includes a touch layer 151 and a touch protection layer 152. The touch layer 151 may be directly formed on the encapsulation layer 140 without using an adhesive member. The touch layer 151 includes a touch electrode which senses a touch input. The touch electrode may be directly formed on the encapsulation layer 140. In this case, a distance between the organic light emitting display panel and the touch electrode is too close so that a parasitic capacitance is generated between the organic light emitting display panel and the touch electrode. Therefore, a touch sensitivity may be lowered. Therefore, the thickness of the encapsulation layer 140 needs to be appropriately adjusted to minimize the parasitic capacitance. The touch electrode may be configured by a sensing electrode and a driving electrode and detects a touch coordinate by sensing a change of the capacitance between the sensing electrode and the driving electrode. For example, the driving electrode is disposed on the encapsulation layer 140 and the sensing electrode is disposed on the same plane as the driving electrode. As another example, a touch insulating layer is disposed on the driving electrode and the sensing electrode is disposed on the touch insulating layer. The arrangement of the touch electrode is not limited thereto and may vary if necessary.

During the process of directly forming the touch layer 151 on the encapsulation layer 140, a touch buffer layer may be disposed between the encapsulation layer 140 and the touch layer 151 to suppress the damage of the encapsulation layer 140 and the organic light emitting element 130.

The touch protection layer 152 is disposed on the touch layer 151. The touch protection layer 152 suppresses the short-circuit or damage of the touch electrode and planarizes an upper surface of the touch layer 151. The touch protection layer 152 may be formed of a transparent insulating resin such as acrylic resin, polyester resin, or silicon resin. In addition, although the organic light emitting display device 100 according to the embodiments of the present disclosure is illustrated as including the touch sensor 150, but the present disclosure is not limited thereto, and the touch sensor 150 may be omitted from the organic light emitting display device if necessary.

An anti-reflection layer AR is disposed on the touch protection layer 152. The anti-reflection layer AR includes a pattern buffer layer 160, a color filter layer 170, and a black matrix 180. The anti-reflection layer AR absorbs external light to minimize the deterioration of the visibility and the contrast ratio of the organic light emitting display device 100 due to the external light.

The pattern buffer layer 160 is disposed above the touch sensor 150 to protect components therebelow such as the touch sensor 150 or the organic light emitting display panel 105. The pattern buffer layer 160 is formed of an inorganic material. The inorganic material has an excellent barrier characteristic to minimize the permeation of moisture. Further, the pattern buffer layer 160 may compensate for deterioration of an adhesiveness between the color filter layer 170 and the black matrix 180 and the touch protection layer 152 which are formed of an organic material. That is, the pattern buffer layer 160 is disposed on the touch protection layer 152 to attach the color filter layer 170 and the black matrix 180 to the touch protection layer 152. For example, the pattern buffer layer 160 may be formed of one or more inorganic materials selected from silicon nitride $SiN_x$, silicon oxide $SiO_x$, silicon oxy nitride SiON, and aluminum oxide $Al_2O_3$.

Since the flexibility of the inorganic material is lower than that of the organic material, when the buffer layer is formed on the entire touch encapsulation layer 140 with an inorganic material, if the organic light emitting display device 100 is bent or folded, crack may be easily generated and spread to cause a driving failure. Therefore, the pattern buffer layer 160 is patterned to have a plurality of pattern blocks and at least one first open area OA1. That is, the plurality of pattern blocks is disposed to be spaced apart from each other and the first open area OA1 is formed between the plurality of pattern blocks. The first open area OA1 alleviates a stress generated when the organic light emitting display device 100 is bent or folded and suppresses the generation and spread of the crack. A configuration of the pattern buffer layer 160 is not limited thereto and may vary so as to suppress the generation and spread of the crack.

Hereinafter, the pattern buffer layer 160 will be described in detail with reference to FIGS. 1B and 1C. The pattern buffer layer 160 may be configured by a plurality of independent pattern blocks 161, 162, 163, and 164 and has the first open area OA1 formed between the plurality of pattern blocks 161, 162, 163, and 164. The first open area OA1 effectively alleviates the stress of the pattern buffer layer 160 to suppress the generation and spread of a crack when the organic light emitting display device 100 is bent or folded.

Each of the plurality of pattern blocks 161, 162, 163, and 164 is disposed on the touch protection layer 152 so as to overlap the plurality of sub pixels SP1, SP2, SP3, and SP4. For example, the pattern buffer layer 160 includes a first pattern block 161 overlapping the first sub pixel SP1, a second pattern block 162 overlapping the second sub pixel SP2, a third pattern block 163 overlapping the third sub pixel SP3, and a fourth pattern block 164 overlapping the fourth sub pixel SP4.

The first pattern block 161, the second pattern block 162, the third pattern block 163, and the fourth pattern block 164 are independently disposed so that the pattern buffer layer 160 has an island shape. For example, the first pattern block 161 and the second pattern block 162 are disposed in the first direction. The third pattern block 163 and the fourth pattern block 164 are disposed along the first direction to be spaced apart from the first pattern block 161 and the second pattern block 162 in the second direction which is different from the first direction. When the pattern buffer layer 160 has an island shape, the stress at the time of folding is alleviated and the generation and spread of the crack may be suppressed.

As illustrated in FIG. 1B, the plurality of pattern blocks may be formed to have an octagonal shape but is not limited thereto. The plurality of pattern blocks may be formed to have a circular shape, an elliptical shape, or a polygonal shape other than an octagonal shape. A width of each of the plurality of pattern blocks 161, 162, 163, and 164 may be larger than a width of an emission area of overlapping sub pixels SP1, SP2, SP3, and SP4, but is not limited thereto. When the width of each of the plurality of pattern blocks 161, 162, 163, and 164 is larger than the width of the emission area, a wider viewing angle may be provided.

The color filter layer 170 is disposed on the encapsulation layer 140. Further, the color filter layer 170 is disposed to be in direct contact with the pattern buffer layer 160 and disposed to cover a partial area of the black matrix 180. The color filter layer 170 absorbs external light to minimize deterioration of the visibility and the contrast ratio due to the external light and improve a color reproduction property. The color filter layer 170 is disposed on the encapsulation layer 140 to improve the luminous efficiency and omit a polarizing plate or a polarization film.

The color filter layer 170 is disposed so as to correspond to a sub pixel disposed therebelow. The color filter layer 170 may include a plurality of color filters. In this case, each color filter may correspond to a color of each corresponding sub pixel. That is, the color filter layer 170 includes a first color filter 171 corresponding to the first sub pixel SP1, a second color filter 172 corresponding to the second sub pixel SP2, a third color filter 173 corresponding to the third sub pixel SP3, and a fourth color filter 174 corresponding to the fourth sub pixel SP4. When the first sub pixel SP1 is a red sub pixel, the first color filter 171 is a red color filter and when the second sub pixel SP2 is a blue sub pixel, the second color filter 172 is a blue color filter. When the third sub pixel SP3 and the fourth sub pixel SP4 are green sub pixels, the third color filter 173 and the fourth color filter 174 are green color filters.

The first color filter 171 is disposed so as to be in direct contact with an upper portion of the first pattern block 161 and the second color filter 172 is disposed so as to be in direct contact with an upper portion of the second pattern block 162. The third color filter 173 is disposed so as to be in direct contact with an upper portion of the third pattern block 163 and the fourth color filter 174 is disposed so as to be in direct contact with an upper portion of the fourth pattern block 164. A width of each pattern block 161, 162, 163, 164 may be larger than a width of the corresponding color filter 171, 172, 173, 174. As described above, the pattern buffer layer 160 attaches the color filter layer 170 and the touch protection layer 152 to each other. When the width of the pattern block 161, 162, 163, 164 is larger than the width of the color filter 171, 172, 173, 174, the adhesiveness is more excellent and the generation and spread of the crack are suppressed to improve the folding characteristic. Further, in order to provide a wide viewing angle, the width of each of the color filters 171, 172, 173, and 174 may be larger than the width of an emission area of overlapping sub pixels SP1, SP2, SP3, and SP4.

Each color filter 171, 172, 173, 174 includes a transparent base resin and a color development material. For example, the transparent base resin may be one selected from polyacrylate, polymethyl methacrylate, polyimide, polyvinyl alcohol, polyethylene, polypropylene, polystyrene, polyethylene terephthalate, and the like, but is not limited thereto.

The color development material absorbs light in a specific wavelength band and transmits light in the other wavelength band. For example, the red color filter includes a red color development material which transmits light in a red wavelength band and absorbs light in green and blue wavelength bands. For example, a red color development material may be a parylene-based compound or a diketo-pyrrolopyrrole-based compound. For example, a green color development material may be a phthalocyanine-based compound. For example, a blue color development material may be a copper phthalocyanine-based compound or an anthraquinone-based compound. However, the color development material is not limited thereto and any material which transmits light in the red, blue, and green wavelength bands may be used without limitations.

As each color filter 171, 172, 173, 174 is disposed so as to correspond to the color of each corresponding sub pixel SP1, SP2, SP3, SP4, internal light emitted from each of the first sub pixel SP1, the second sub pixel SP2, the third sub pixel SP3, and the fourth sub pixel SP4 passes through the color filter. For example, red light emitted from the first sub pixel SP1 passes through the first color filter 171. In contrast, when the external light is incident, external light corresponding to an absorption wavelength of the color development material included in each color filter 171, 172, 173, 174 is absorbed by each color filter 171, 172, 173, 174. The external light which is not absorbed by the color filters 171, 172, 173, and 174 is reflected by the cathode 133 to pass through the color filters 171, 172, 173, and 174 again. Reflected light corresponding to an absorption wavelength of the color development material included in each color filter 171, 172, 173, 174 is absorbed by each color filter 171, 172, 173, 174. Therefore, the deterioration of the display quality due to the external light may be minimized.

In FIGS. 1B and 1C, it is illustrated that the color filters 171, 172, 173, and 174 are independently disposed so as to correspond to the plurality of sub pixels SP1, SP2, SP3, and SP4, respectively, but are not limited thereto. The color filter layer 170 may be formed as a single layer. For example, the color filter layer 170 may be disposed as a single layer so as to cover an upper portion of the pattern buffer layer 160 and the black matrix 180. In this case, the color filter layer 170 may include a base resin, a red color development material, a green color development material, and a blue color development material, but is not limited thereto. If necessary, some color development materials may be omitted and other color development materials may be further included in addition to the red color development material, the green color development material, and the blue color development material.

The black matrix 180 is disposed on the touch protection layer 152 and the pattern blocks 161, 162, 163, and 164. The black matrix 180 may be disposed so as to correspond to the bank 125. Therefore, the color mixture between the sub pixels SP1, SP2, SP3, and SP4 may be minimized. Further, the black matrix 180 absorbs external light. Therefore, the deterioration of the visibility and the contrast ratio of the organic light emitting display device 100 due to the external light may be minimized.

The black matrix 180 may be formed of an organic material. The black matrix 180 includes a base resin and a black material. The base resin may be one or more selected from cardo-based resin, epoxy-based resin, acrylate-based resin, siloxane-based resin, and polyimide, but is not limited thereto. The black material may be a black pigment selected from a carbon-based pigment, a metal oxide-based pigment, and an organic-based pigment. For example, the carbon-based pigment may be carbon black. For example, the metal oxide-based pigment may be titanium black $TiN_xO_y$, or Cu—Mn—Fe-based black pigment, but is not limited thereto. For example, the organic-based pigment may be selected from lactam black, perylene black, and aniline black, but is not limited thereto. Further, as the black material, an RGB black pigment including a red pigment, a blue pigment, and a green pigment may be used.

The black matrix 180 is disposed in the first open area OA1 between the pattern blocks 161, 162, 163, and 164 on the same plane as the pattern buffer layer 160 to divide the adjacent pattern blocks. That is, the black matrix 180 which is formed of a relatively flexible organic material compared to the inorganic material is disposed in the first open area OA1 between the pattern blocks 161, 162, 163, and 164. Therefore, the stress caused when the organic light emitting display device 100 is bent or folded may be reduced. Further, the crack generated when the display device is bent or folded may be minimized. Generally, the crack is easily generated and spreads in a layer formed of an inorganic material. However, in the pattern buffer layer 160 of the present disclosure, the black matrix 180 formed of an organic material is disposed in the first open area OA1 between the pattern blocks 161, 162, 163, and 164 so that the spread of the crack may be suppressed.

In FIG. 1C, it is illustrated that the anti-reflection layer AR including the pattern buffer layer 160, the color filter layer 170, and the black matrix 180 is disposed above the touch protection layer 152, but is not limited thereto. For example, the anti-reflection layer AR may be disposed above the encapsulation layer 140 of the organic light emitting display panel 105 or the touch sensor 150 may be disposed above the anti-reflection layer AR. When the touch sensor 150 is disposed above the anti-reflection layer AR, an over coating layer may be disposed to cover a step of the anti-reflection layer AR and planarize an upper surface, and the touch sensor 150 is disposed on the over coating layer. In this case, the distance between the touch electrode and the organic light emitting display panel is increased so that a parasitic capacitance formed therebetween is reduced, and a distance from an outermost surface to which the touch is input to the touch electrode is reduced so that a touch sensitivity may be improved.

Further, when the anti-reflection layer AR is disposed above the encapsulation layer 140, the second inorganic layer 143 may be utilized as a pattern buffer layer. That is, the second inorganic layer 143 is patterned to form a pattern buffer layer without separately forming a pattern buffer layer on the second inorganic layer 143.

The organic light emitting display device 100 according to the exemplary embodiment of the present disclosure may further include an auxiliary pattern buffer layer 190 formed in the non-display area NDA. Hereinafter, the auxiliary pattern buffer layer 190 will be described in detail with reference to FIGS. 1D and 1E.

Referring to FIGS. 1D and 1E in which a fourth organic light emitting element 130d disposed in the fourth sub pixel SP4 is further illustrated, the auxiliary pattern buffer layer 190 may be disposed on the touch protection layer 152 which is the same plane as the pattern buffer layer 160. The auxiliary pattern buffer layer 190 is formed along at least one edge of the non-display area NDA. For example, the auxiliary pattern buffer layer 190 may be formed along an edge extending along the first direction of the non-display area NDA or along an edge extending along the second direction. Further, the auxiliary pattern buffer layer 190 may be formed along an edge extending along the first direction and an edge extending along the second direction. That is, the auxiliary pattern buffer layer 190 has a frame shape. As described above, when the auxiliary pattern buffer layer which is formed along at least one edge of the non-display area NDA is included, the folding characteristic may be further improved and the generation and spread of the crack at the edge of the organic light emitting display device 100 may be suppressed. Moreover, it is more advantageously applied to the organic light emitting display device 100 having a large folding stress such as an organic light emitting display device 100 having a large thickness or a multi-folding organic light emitting display device 100.

The auxiliary pattern buffer layer 190 includes a plurality of auxiliary pattern buffers. For example, the auxiliary pattern buffer layer 190 includes a first auxiliary pattern buffer 191, a second auxiliary pattern buffer 192, and a third auxiliary pattern buffer 193 and includes a second open area OA2 therebetween. The first auxiliary pattern buffer 191, the second auxiliary pattern buffer 192, and the third auxiliary pattern buffer 193 are disposed to be spaced apart from each other so that the second open area OA2 is formed between the plurality of auxiliary pattern buffers. The second open area OA2 may alleviate the folding stress so that the generation and spread of the crack when the organic light emitting display device 100 is bent or folded may be minimized.

Figure 2:
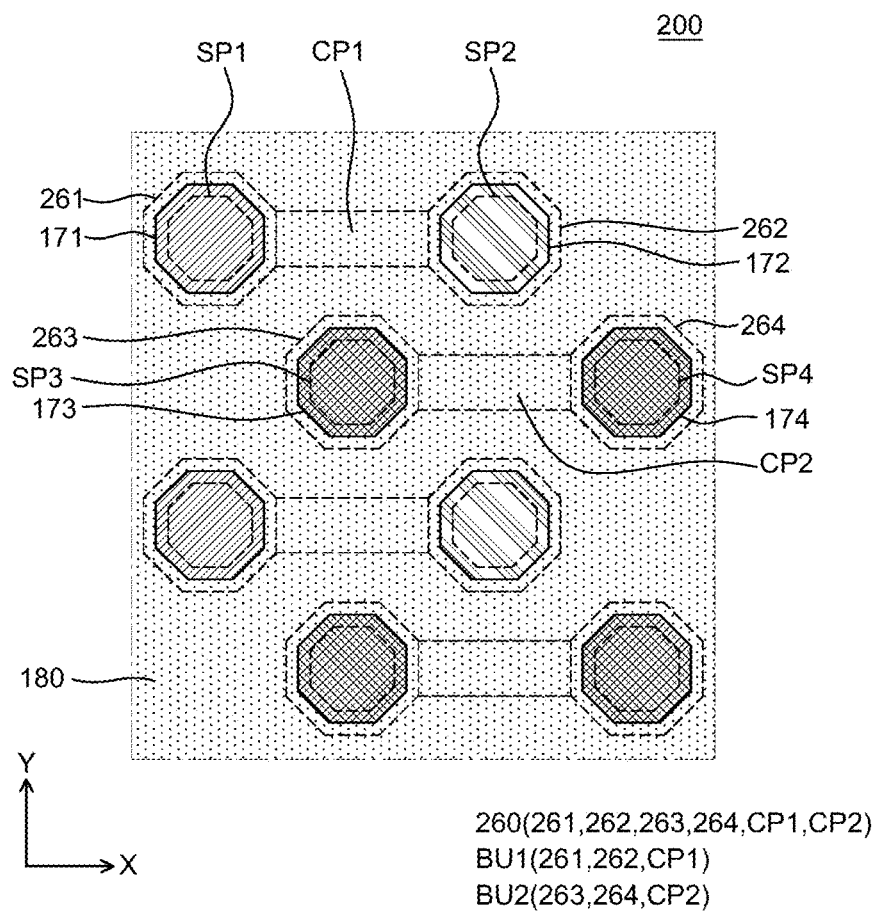
FIG. 2 is an enlarged view of a partial area of an organic light emitting display device according to another exemplary embodiment of the present disclosure.

FIG. 2 is an enlarged view of a partial area of an organic light emitting display device according to another exemplary embodiment of the present disclosure. Referring to FIG. 2, in an organic light emitting display device 200 according to another exemplary embodiment of the present disclosure, a pattern buffer layer 260 includes a plurality of pattern blocks 261, 262, 263, and 264 and connection blocks CP1 and CP2. The organic light emitting display device 200 of FIG. 2 is substantially the same as the organic light emitting display device 100 illustrated in FIGS. 1A to 1E except that a connection block is further provided between a plurality of pattern blocks of a pattern buffer layer. Therefore, a description of a repeated configuration will be omitted.

Referring to FIG. 2, a connection block disposed between pattern blocks 261, 262, 263, and 264 includes a first connection block CP1 and a second connection block CP2. The first connection block CP1 is disposed between the first pattern block 261 and the second pattern block 262 to connect the first pattern block 161 and the second pattern block 262. The second connection block CP2 is disposed between the third pattern block 263 and the fourth pattern block 264 to connect the third pattern block 263 and the fourth pattern block 264. A width of each of the first pattern block 261 and the second pattern block 262 is larger than a width of the first connection block CP1 and a width of each of the third pattern block 263 and the fourth pattern block 264 is larger than a width of the second connection block CP2.

The first pattern block 261, the second pattern block 262, and the first connection block CP1 configure a first block unit BU1, and the third pattern block 263, the fourth pattern block 264, and the second connection block CP2 configure a second block unit BU2. That is, each of the first block unit BU1 and the second block unit BU2 overlaps two sub pixels. For example, the first block unit BU1 overlaps the first sub pixel SP1 and the second sub pixel SP2, and the second block unit BU2 overlaps the third sub pixel Sp3 and the fourth sub pixel SP4.

The first block unit BU1 and the second block unit BU2 are spaced apart from each other without overlapping to be disposed in a zigzag pattern in the second direction (the y-axis direction). When the first block unit BU1 and the second block unit BU2 are disposed in a zigzag pattern, an aperture ratio of the pixel may be improved and the folding stress may be more effectively alleviated.

At least one of the first connection block CP1 and the second connection block CP2 may be patterned to have at least one open area. For example, at least one of the first connection block CP1 and the second connection block CP2 may be patterned to have a stripe shape. In this case, the folding stress may be further reduced and the generation and spread of the crack may be more effectively suppressed.

Figure 3:
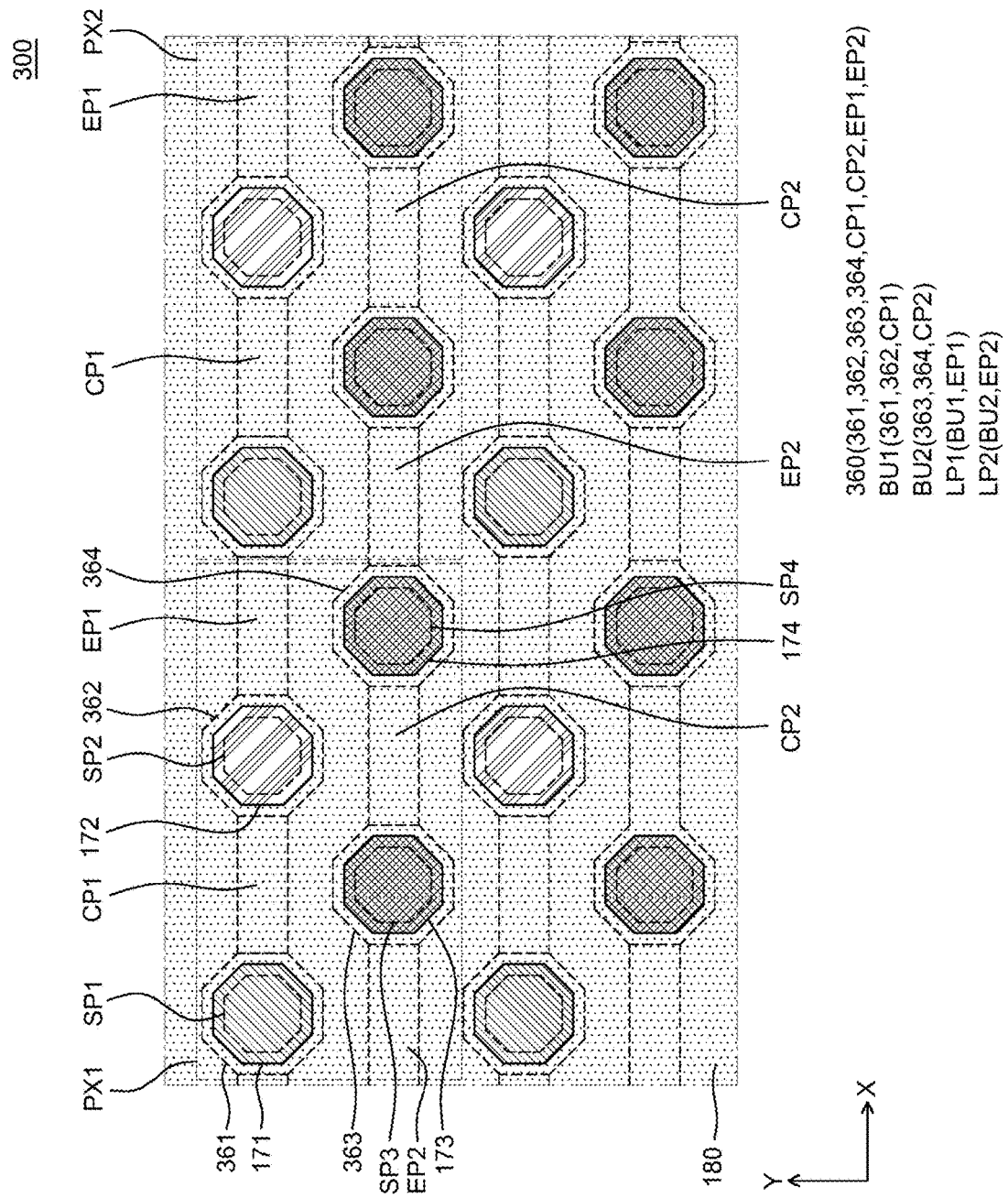
FIG. 3 is an enlarged view of a partial area of an organic light emitting display device according to still another exemplary embodiment of the present disclosure.

FIG. 3 is an enlarged view of a partial area of an organic light emitting display device according to still another exemplary embodiment of the present disclosure. Referring to FIG. 3, an organic light emitting display device 300 according to still another exemplary embodiment is substantially the same as the organic light emitting display device 200 illustrated in FIG. 2 except that adjacent first block units BU1 extend to be long by a first extension block EP1 without being disconnected and adjacent second block units BU2 extend to be long by a second extension block EP2 without being disconnected. Therefore, a description of a repeated configuration will be omitted.

Referring to FIG. 3, in an organic light emitting display device 300 according to another exemplary embodiment of the present disclosure, a pattern buffer layer 360 includes a first block unit BU1 and a second block unit BU2. The first block unit BU includes a first pattern block 361, a second pattern block 362, and a first connection block CP1 and the second block unit BU2 is configured by a third pattern block 363, a fourth pattern block 364, and a second connection block CP2.

The first block unit BU1 configured by the first pattern block 361, the second pattern block 362, and the first connection block CP1 disposed therebetween is repeatedly disposed in the first direction (the x-axis direction) and the first extension block EP1 connects the first block units BU1 which are repeatedly disposed along the first direction.

That is, the second pattern block 362 of the first pixel PX1 and the first pattern block 361 of the second pixel PX2 are connected to each other by the first extension block EP1. Accordingly, the first block units BU1 and the first extension blocks EP1 are alternately repeatedly disposed and the first block units BU1 extend to be long by the first extension block EP1 without being disconnected to form a first line pattern LP1.

The second block unit BU2 configured by the third pattern block 363, the fourth pattern block 364, and the second connection block CP2 disposed therebetween is spaced apart from the first block unit BU1 in the second direction and is repeatedly disposed along the first direction. The second extension block EP2 connects the second block units BU2 which are repeatedly disposed along the first direction.

That is, the fourth pattern block 364 of the first pixel PX1 and the third pattern block 363 of the second pixel PX2 are connected to each other by the second extension block EP2. Accordingly, the second block units BU2 and the second extension blocks EP2 are alternately repeatedly disposed and the second block units BU2 extend to be long by the second extension block EP2 without being disconnected to form a second line pattern LP2.

The second line pattern LP2 is disposed to be spaced apart from the first line pattern LP1 in the second direction.

The first line pattern LP1 and the second line pattern LP2 may extend in the first direction without having an open area. Therefore, when a crack is generated, the crack may be spread along an extending direction of the line pattern. Therefore, in order to minimize the generation and spread of the crack, at least one of the plurality of first connection blocks CP1 and/or at least one of the first extension blocks EP1 may be patterned to have an open area. Further, at least one of the plurality of second connection blocks CP2 and/or at least one of the plurality of second extension blocks EP2 may be patterned to have an open area. For example, at least one of the plurality of first connection blocks CP1 and at least one of the plurality of second connection blocks CP2 may be patterned to have a stripe shape. Further, at least one of the plurality of first extension blocks EP1 and at least one of the plurality of second extension blocks EP2 may be patterned to have a stripe shape. In this case, the crack may be further suppressed and even though the crack is generated, the spread of the crack along the extending direction of the line pattern may be minimized.

Figure 4A:
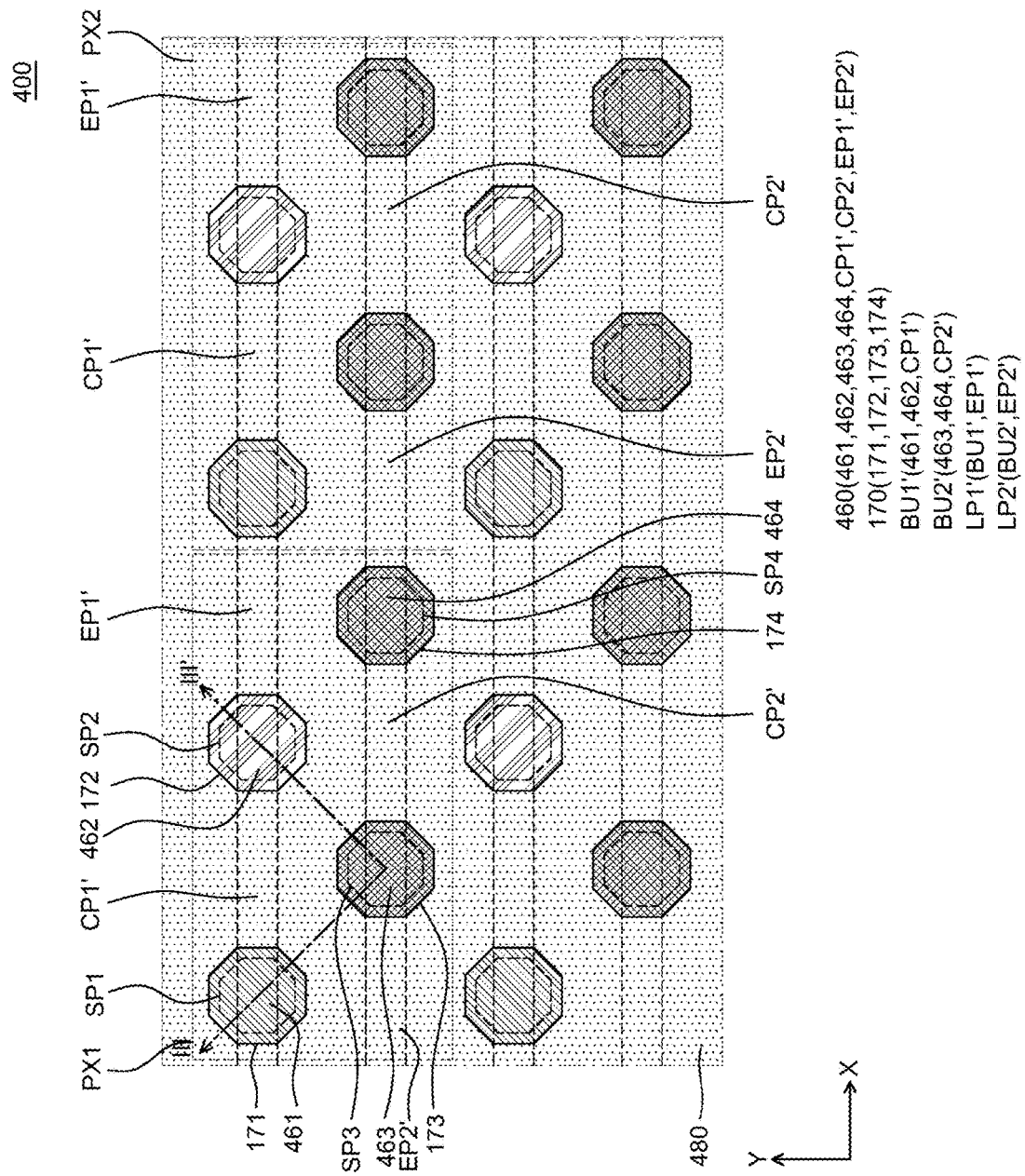
FIG. 4A is an enlarged view of a partial area of an organic light emitting display device according to still another exemplary embodiment of the present disclosure.
Figure 4B:
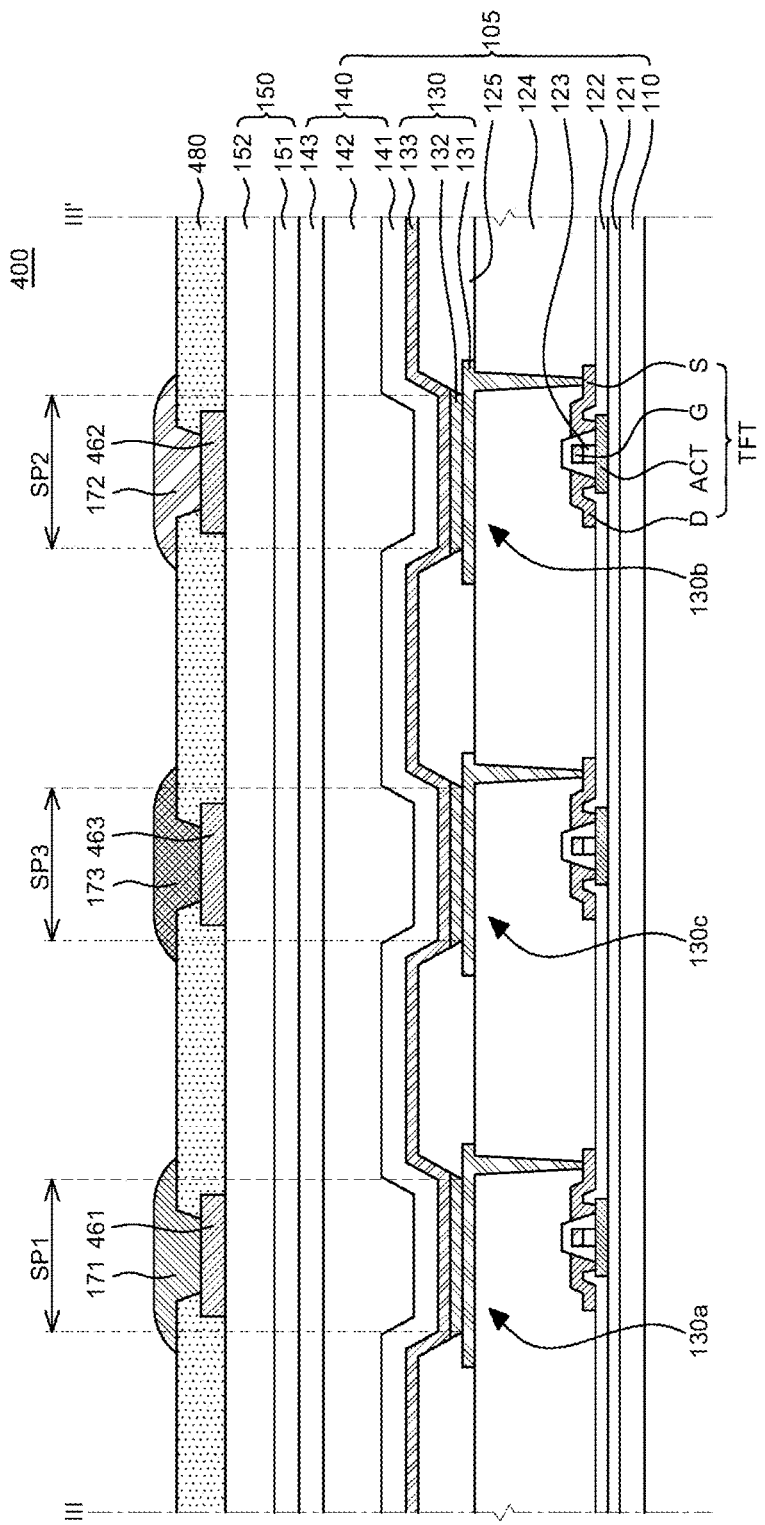
FIG. 4B is a cross-sectional view taken along the line III-III' of FIG. 4A.

FIG. 4A is an enlarged view of a partial area of an organic light emitting display device according to still another exemplary embodiment of the present disclosure. FIG. 4B is a cross-sectional view taken along the line III-III' of FIG. 4A. Referring to FIGS. 4A and 4B, an organic light emitting display device 400 according to another exemplary embodiment of the present disclosure is substantially the same as the organic light emitting display device 300 illustrated in FIG. 3 except for a shape and a width of a first line pattern LP1' and a second line pattern LP2', and a shape of a black matrix 480. Therefore, a description of a repeated configuration will be omitted.

Referring to FIGS. 4A and 4B, in the organic light emitting display device 400 according to another exemplary embodiment of the present disclosure, a pattern buffer layer 460 includes a first block unit BU1' and a second block unit BU2'. The first block unit BU1' is configured by a first pattern block 461, a second pattern block 462, and a first connection block CP1' and the second block unit BU2' is configured by a third pattern block 463, a fourth pattern block 464, and a second connection block CP2'.

The first block unit BU1' configured by the first pattern block 461, the second pattern block 462, and the first connection block CP1' disposed therebetween is repeatedly disposed in the first direction (the x-axis direction) and a first extension block EP1' connects the first block units BU1' which are repeatedly disposed along the first direction.

That is, the second pattern block 462 of the first pixel PX1 and the first pattern block 461 of the second pixel PX2 are connected to each other by the first extension block EP1'. Accordingly, the first block units BU1' and the first extension blocks EP1' are alternately repeatedly disposed and the first block units BU1' extend to be long by the first extension block EP1' without being disconnected to form a first line pattern LP1'.

The second block unit BU2' configured by the third pattern block 463, the fourth pattern block 464, and the second connection block CP2' disposed therebetween is spaced apart from the first block unit BU1' in the second direction and is repeatedly disposed along the first direction. A second extension block EP2' connects the second block units BU2' which are repeatedly disposed along the first direction.

That is, the fourth pattern block 464 of the first pixel PX1 and the third pattern block 463 of the second pixel PX2 are connected to each other by the second extension block EP2'. Accordingly, the second block units BU2' and the second extension blocks EP2' are alternately repeatedly disposed and the second block units BU2' extend to be long by the second extension block EP2' without being disconnected to form a second line pattern LP2'.

The first pattern block 461, the second pattern block 462, and the first connection block CP1' which configure the first block unit BU1' have the same width. Further, the first block unit BU1' and the first extension block EP1' which configure the first line pattern LP1' have the same width. Therefore, the first line pattern LP1' has a linear shape with a constant width.

The third pattern block 463, the fourth pattern block 464, and the second connection block CP2' which configure the second block unit BU2' have the same width. Further, the second block unit BU2' and the second extension block EP2' which configure the second line pattern LP2' have the same width. Therefore, the second line pattern LP2' has a linear shape with a constant width.

The second line pattern LP2' is disposed to be spaced apart from the first line pattern LP1' in the second direction. Therefore, the pattern buffer layer 460 has a stripe shape in which the first line pattern LP1' and the second line pattern LP2' having a linear shape with a constant width are repeatedly disposed to be spaced apart from each other in the second direction. As compared with the pattern buffer layer 360 illustrated in FIG. 3, the pattern buffer layer 460 having a stripe shape as illustrated in FIG. 4A has a process advantage in that it is easy to control the widths of the first line pattern LP1' and the second line pattern LP2' and an interval between the first line pattern LP1' and the second line pattern LP2'.

The first line pattern LP1' and the second line pattern LP2' may extend along the first direction without having an open area. In this case, when the crack is generated, the crack may be spread along the extending direction. Therefore, in order to minimize the generation and spread of the crack, at least one of the plurality of first connection blocks CP1' and/or at least one of the plurality of first extension blocks EP1' may be patterned to have an open area. Further, at least one of the plurality of second connection blocks CP2' and/or at least one of the plurality of second extension blocks EP2' may be patterned to have an open area. For example, at least one of the plurality of first connection blocks CP1' and at least one of the plurality of first extension blocks EP1' may be patterned to have a stripe shape. Further, at least one of the plurality of second connection blocks CP2' and at least one of the plurality of second extension blocks EP2' may be patterned to have a stripe shape. In this case, the first line pattern LP1' and the second line pattern LP2' which are spaced apart from each other to extend along the first direction are patterned to have an open area so that the folding stress is alleviated and the generation and spread of the crack may be minimized.

The widths of the first line pattern LP1' and the second line pattern LP2' may be formed to be smaller than the widths of the color filters 171, 172, 173, and 174 correspondingly disposed thereto, but are not limited thereto. In addition, as shown in FIG. 4B, the widths of the first pattern block 461, the second pattern block 462, the third pattern block 463 and the fourth pattern block 464 may be formed to be smaller than the width of the emission area of overlapping sub pixels SP1, SP2, SP3, and SP4.

Figure 5A:
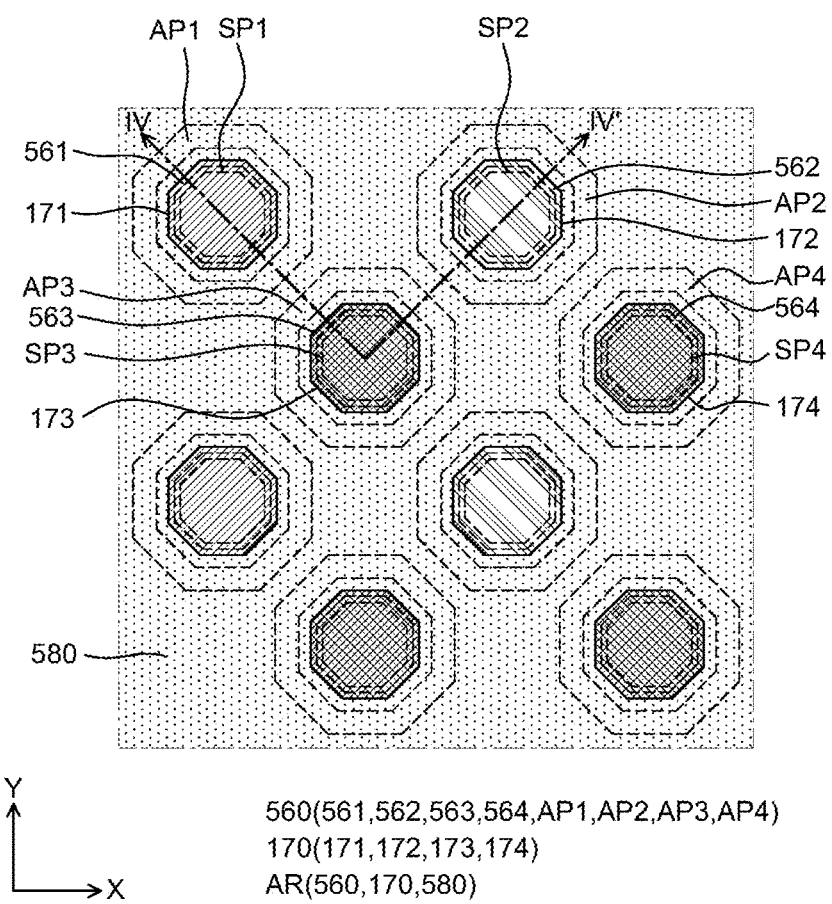
FIG. 5A is an enlarged view of a partial area of an organic light emitting display device according to still another exemplary embodiment of the present disclosure.
Figure 5B:
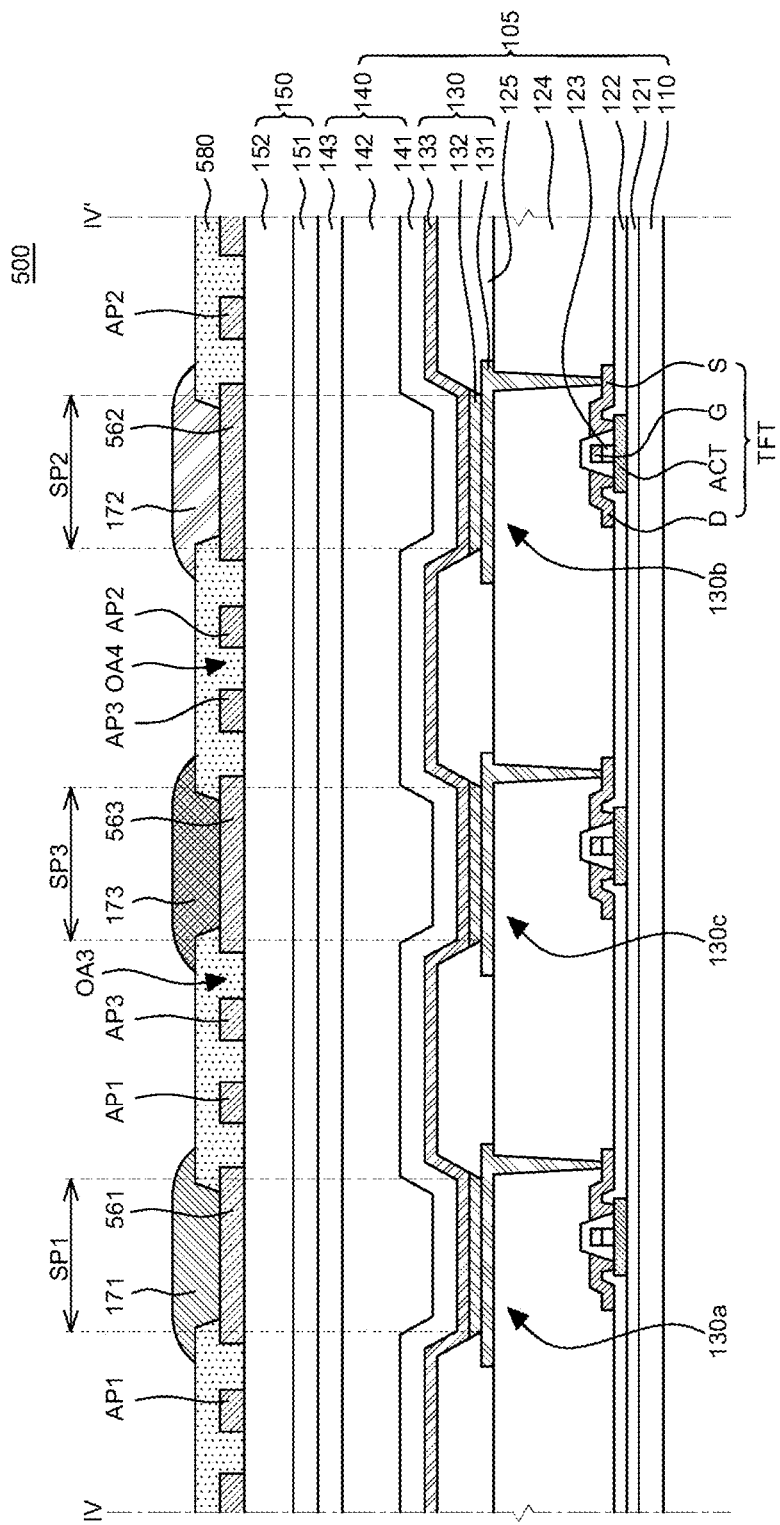
FIG. 5B is a cross-sectional view taken along the line IV-IV' of FIG. 5A.

FIG. 5A is an enlarged view of a partial area of an organic light emitting display device according to still another exemplary embodiment of the present disclosure. FIG. 5B is a cross-sectional view taken along the line IV-IV' of FIG. 5A. Referring to FIGS. 5A and 5B, an organic light emitting display device 500 according to still another exemplary embodiment of the present disclosure includes an organic light emitting display panel 105, a touch sensor 150, and an anti-reflection layer AR. Further, the anti-reflection layer AR includes a pattern buffer layer 560, a color filter layer 170, and a black matrix 580. The pattern buffer layer 560 includes a plurality of pattern blocks 561, 562, 563, and 564 and auxiliary pattern blocks AP1, AP2, AP3, and AP4 disposed between the plurality of pattern blocks 561, 562, 563, and 564. The organic light emitting display device 500 according to still another exemplary embodiment of the present disclosure is substantially the same as the organic light emitting display device 400 illustrated in FIGS. 4A and 4B except that the pattern buffer layer 560 further includes auxiliary pattern blocks between the plurality of pattern blocks. Therefore, a description of the repeated components will not be described.

Referring to FIGS. 5A and 5B, the pattern buffer layer 560 includes auxiliary pattern blocks between the plurality of pattern blocks 561, 562, 563, and 564. When the auxiliary pattern block is included, the folding stress of the pattern buffer layer 560 may be further reduced and the generation and spread of the crack may be effectively suppressed.

The auxiliary pattern block may be formed to have a band shape so as to enclose at least one pattern block of a first pattern block 561, a second pattern block 562, a third pattern block 563, and a fourth pattern block 564. For example, the auxiliary pattern block includes a first auxiliary pattern block AP1 which encloses the first pattern block 561, a second auxiliary pattern block AP2 which encloses the second pattern block 562, a third auxiliary pattern block AP3 which encloses the third pattern block 563, and a fourth auxiliary pattern block AP4 which encloses the fourth pattern block 564. In FIGS. 5A and 5B, it is illustrated that the auxiliary pattern blocks AP1, AP2, AP3, and AP4 are disposed to enclose the first pattern block 561, the second pattern block 562, the third pattern block 563, and the fourth pattern block 564 in a band shape, but are not limited thereto. The auxiliary pattern block may be disposed between the plurality of pattern blocks with various shapes to alleviate the folding stress and suppress the generation and spread of the crack.

In the pattern buffer layer 560, as the auxiliary pattern blocks AP1, AP2, AP3, and AP4 are disposed between the plurality of pattern blocks 561, 562, 563, and 564, a third open area OA3 is formed between the pattern blocks 561, 562, 563, and 564 and the auxiliary pattern blocks AP1, AP2, AP3, and AP4. Further, a fourth open area OA4 is disposed between the auxiliary pattern blocks AP1, AP2, AP3, and AP4. In this case, the folding stress of the pattern buffer layer 560 is further alleviated and the generation and spread of the crack may be minimized.

The black matrix 580 is disposed between the plurality of pattern blocks 561, 562, 563, and 564 on the same plane as the pattern buffer layer 560. Therefore, the black matrix 580 is in contact with an upper surface and side surface of the auxiliary pattern blocks AP1, AP2, AP3, and AP4 which are disposed so as to enclose the pattern blocks 561, 562, 563, and 564. Further, the black matrix 580 covers the third open area OA3 and the fourth open area OA4. In the third and fourth open areas OA3 and OA4, the black matrix 580 which is formed of a relatively flexible organic material compared to the pattern buffer layer 560 formed of an inorganic material is disposed. Therefore, the folding stress is significantly reduced and the generation and spread of the crack due to folding may be further effectively suppressed.

The exemplary embodiments of the present disclosure can also be described as follows:

According to an aspect of the present disclosure, there is provided an organic light emitting display device. The organic light emitting display device comprises an organic light emitting display panel including a plurality of sub pixels, a pattern buffer layer disposed on the organic light emitting display panel and patterned so as to overlap at least one sub pixel of the plurality of sub pixels, a color filter layer disposed on the pattern buffer layer and including a plurality of color filters corresponding to the plurality of sub pixels, and a black matrix disposed on the same plane as the pattern buffer layer and dividing each of the plurality of color filters.

The pattern buffer layer may include a plurality of independent pattern blocks and each of the plurality of pattern blocks may be disposed so as to overlap the plurality of sub pixels to have an island shape.

The pattern buffer layer further may include at least one connection block which is disposed between the plurality of pattern blocks to connect two adjacent pattern blocks.

The connection block may be patterned to have at least one open area.

The plurality of sub pixels may include a first sub pixel and a second sub pixel disposed along a first direction, and a third sub pixel and a fourth sub pixel which are spaced apart from the first sub pixel and the second sub pixel in a second direction and disposed along the first direction, the plurality of pattern blocks may include a first pattern block overlapping the first sub pixel, a second pattern block overlapping the second sub pixel, a third pattern block overlapping the third sub pixel, and a fourth pattern block overlapping the fourth sub pixel, and the connection block may include a first connection block connecting the first pattern block and the second pattern block, and a second connection block connecting the third pattern block and the fourth pattern block.

The first pattern block, the second pattern block, and the first connection block may configure a first block unit and the third pattern block, the fourth pattern block, and the second connection block configure a second block unit, and the first block unit and the second block unit may be disposed in a zigzag pattern in the second direction.

The pattern buffer layer further may include a first extension block connecting two first block units which are adjacent to each other, and a second extension block connecting two second block units which are adjacent to each other, the first block units straightly extend by the first extension block along the first direction to configure a first line pattern, the second block units straightly extend by the second extension block along the first direction to configure a second line pattern, and the second line pattern may be spaced apart from the first line pattern in the second direction.

The plurality of color filters may be disposed on the pattern buffer layer so as to correspond to the plurality of pattern blocks, respectively, and a width of each of the plurality of pattern blocks may be larger than a width of each of the plurality of color filters.

The first block unit and the first extension block may have the same width so that the first line pattern extends with a constant width, and the second block unit and the second extension block may have the same width so that the second line pattern extends with a constant width.

The respective widths of the first line pattern and the second line pattern may be smaller than the width of the plurality of color filters.

The pattern buffer layer further may include an auxiliary pattern block disposed between the plurality of pattern blocks.

The auxiliary pattern block may be disposed so as to enclose at least one pattern block of the plurality of pattern blocks.

The black matrix may be disposed to be in direct contact with a top surface and a side surface of the auxiliary pattern block.

The organic light emitting display panel may include a display area in which the plurality of sub pixels is disposed and a non-display area enclosing the display area. The organic light emitting display panel further may include an auxiliary pattern buffer layer disposed on the organic light emitting display panel along at least one edge of the non-display area.

The auxiliary pattern buffer layer may include a plurality of auxiliary pattern buffers and may have an open area between the plurality of auxiliary pattern buffers.

Each of the plurality of auxiliary pattern buffers may be disposed along the edge of the non-display area to have a frame shape.

According to another aspect of the present disclosure, there is provided an organic light emitting display device with a plurality of sub pixels. The organic light emitting display device with the plurality of sub pixels comprises a substrate, a thin film transistor disposed on the substrate, an organic light emitting element disposed on the thin film transistor, an encapsulation layer disposed on the organic light emitting element, and an anti-reflection layer disposed on the encapsulation layer. Further, the anti-reflection layer may include a pattern buffer layer patterned so as to overlap at least one sub pixel of the plurality of sub pixels and including at least one open area, a color filter layer disposed on the pattern buffer layer, and a black matrix disposed in the open area.

The organic light emitting display device further may comprise a touch layer disposed between the encapsulation layer and the anti-reflection layer.

The pattern buffer layer may include a plurality of pattern blocks disposed to be spaced apart from each other, and each of the plurality of pattern blocks is disposed so as to overlap each of the plurality of sub pixels to have an island shape.

The pattern buffer layer further may include a connection block disposed between the plurality of pattern blocks to connect two adjacent pattern blocks.

It will be apparent to those skilled in the art that various modifications and variations can be made in the present disclosure without departing from the technical idea or scope of the disclosure. Thus, it is intended that the present disclosure cover the modifications and variations of this disclosure provided they come within the scope of the appended claims and their equivalents.

What is claimed is:

1. An organic light emitting display device, comprising:
   an organic light emitting display panel including a plurality of sub pixels;
   a pattern buffer layer disposed on the organic light emitting display panel and patterned so as to overlap at least one sub pixel of the plurality of sub pixels;
   a color filter layer disposed on the pattern buffer layer and including a plurality of color filters corresponding to the plurality of sub pixels; and
   a black matrix disposed on the same plane as the pattern buffer layer and dividing each of the plurality of color filters.

2. The organic light emitting display device according to claim 1, wherein the pattern buffer layer is formed of an inorganic material.

3. The organic light emitting display device according to claim 1, wherein the pattern buffer layer includes a plurality of pattern blocks that are spaced apart from each other and each of the plurality of pattern blocks is disposed so as to overlap the plurality of sub pixels to have an island shape.

4. The organic light emitting display device according to claim 3, wherein the pattern buffer layer further includes at least one connection block which is disposed between the plurality of pattern blocks to connect two adjacent pattern blocks.

5. The organic light emitting display device according to claim 4, wherein the connection block is patterned to have at least one open area.

6. The organic light emitting display device according to claim 4, wherein the plurality of sub pixels includes a first sub pixel and a second sub pixel disposed along a first direction, and a third sub pixel and a fourth sub pixel spaced apart from the first sub pixel and the second sub pixel in a second direction and disposed along the first direction,
   the plurality of pattern blocks includes a first pattern block overlapping the first sub pixel, a second pattern block overlapping the second sub pixel, a third pattern block overlapping the third sub pixel, and a fourth pattern block overlapping the fourth sub pixel, and
   the connection block includes a first connection block connecting the first pattern block and the second pattern block, and a second connection block connecting the third pattern block and the fourth pattern block.

7. The organic light emitting display device according to claim 6, wherein the first pattern block, the second pattern block, and the first connection block configure a first block unit, and the third pattern block, the fourth pattern block, and the second connection block configure a second block unit, and
   the first block unit and the second block unit are disposed in a zigzag pattern in the second direction.

8. The organic light emitting display device according to claim 7, wherein the pattern buffer layer further includes a first extension block connecting two first block units which are adjacent to each other, and a second extension block connecting two second block units which are adjacent to each other, the first block units straightly extend by the first extension block along the first direction to configure a first line pattern, the second block units straightly extend by the second extension block along the first direction to configure a second line pattern, and the second line pattern is spaced apart from the first line pattern in the second direction.

9. The organic light emitting display device according to claim 8, wherein the first block unit and/or the first extension block is patterned to have an open area, and wherein the second block unit and/or the second extension block is patterned to have an open area.

10. The organic light emitting display device according to claim 3, wherein the plurality of color filters is disposed on the pattern buffer layer so as to correspond to the plurality of pattern blocks, respectively, and a width of each of the plurality of pattern blocks is larger than a width of each of the plurality of color filters.

11. The organic light emitting display device according to claim 8, wherein the first block unit and the first extension block have the same width so that the first line pattern extends with a constant width, and the second block unit and the second extension block have the same width so that the second line pattern extends with a constant width.

12. The organic light emitting display device according to claim 11, wherein the respective widths of the first line pattern and the second line pattern are smaller than the width of the plurality of color filters.

13. The organic light emitting display device according to claim 3, wherein the pattern buffer layer further includes an auxiliary pattern block disposed between the plurality of pattern blocks.

14. The organic light emitting display device according to claim 13, wherein an open area is formed between the auxiliary pattern block and the plurality of pattern blocks.

15. The organic light emitting display device according to claim 13, wherein the auxiliary pattern block is disposed so as to enclose at least one pattern block of the plurality of pattern blocks.

16. The organic light emitting display device according to claim 13, wherein the black matrix is disposed to be in direct contact with a top surface and a side surface of the auxiliary pattern block.

17. The organic light emitting display device according to claim 1, wherein the organic light emitting display panel includes a display area in which the plurality of sub pixels is disposed and a non-display area enclosing the display area and further includes an auxiliary pattern buffer layer disposed on the organic light emitting display panel along at least one edge of the non-display area.

18. The organic light emitting display device according to claim 17, wherein the auxiliary pattern buffer layer includes a plurality of auxiliary pattern buffers and has an open area between the plurality of auxiliary pattern buffers.

19. The organic light emitting display device according to claim 18, wherein each of the plurality of auxiliary pattern buffers is disposed along the edge of the non-display area to have a frame shape.

20. An organic light emitting display device including a plurality of sub pixels, comprising:

a substrate;

a thin film transistor disposed on the substrate;

an organic light emitting element disposed on the thin film transistor;

an encapsulation layer disposed on the organic light emitting element; and an anti-reflection layer disposed on the encapsulation layer, wherein the anti-reflection layer includes:

a pattern buffer layer patterned so as to overlap at least one sub pixel of the plurality of sub pixels and including at least one open area;

a color filter layer disposed on the pattern buffer layer; and a black matrix disposed in the open area.

21. The organic light emitting display device according to claim 20, further comprising:

a touch sensor disposed between the encapsulation layer and the anti-reflection layer.

22. The organic light emitting display device according to claim 20, further comprising:

a touch sensor disposed on the anti-reflection layer.

23. The organic light emitting display device according to claim 20, wherein the pattern buffer layer includes a plurality of pattern blocks disposed to be spaced apart from each other and each of the plurality of pattern blocks is disposed so as to overlap each of the plurality of sub pixels to have an island shape.

24. The organic light emitting display device according to claim 23, wherein the pattern buffer layer further includes a connection block disposed between the plurality of pattern blocks to connect two adjacent pattern blocks.

* * * * *